(12) United States Patent
Kyusojin et al.

(10) Patent No.: US 7,961,614 B2
(45) Date of Patent: Jun. 14, 2011

(54) INFORMATION PROCESSING DEVICE, INFORMATION PROCESSING METHOD, AND RECORDING MEDIUM FOR REDUCING CONSUMPTION OF MEMORY CAPACITY

(75) Inventors: Hiroshi Kyusojin, Tokyo (JP); Masato Kajimoto, Chiba (JP); Chiaki Yamana, Kanagawa (JP); Tsuyoshi Kano, Tokyo (JP); Mitsuki Hinosugi, Kanagawa (JP); Hideki Matsumoto, Tokyo (JP)

(73) Assignee: Sony Corporation, Tokyo (JP)

( * ) Notice: Subject to any disclaimer, the term of this patent is extended or adjusted under 35 U.S.C. 154(b) by 506 days.

(21) Appl. No.: 11/669,679

(22) Filed: Jan. 31, 2007

(65) Prior Publication Data

US 2007/0242682 A1 Oct. 18, 2007

(30) Foreign Application Priority Data

Feb. 1, 2006 (JP) ................................ 2006-024646

(51) Int. Cl.
*H04L 9/00* (2006.01)
(52) U.S. Cl. ........ 370/232; 370/390; 370/392; 370/393; 714/52; 714/53; 714/54
(58) Field of Classification Search .................. 370/392, 370/232, 393, 390; 714/52, 53, 54
See application file for complete search history.

(56) References Cited

U.S. PATENT DOCUMENTS

| | | | |
|---|---|---|---|
| 6,442,617 B1 * | 8/2002 | Lowe et al. ................ | 709/250 |
| 7,274,695 B2 * | 9/2007 | Kim et al. .................. | 370/389 |
| 2002/0104006 A1 * | 8/2002 | Boate et al. ................ | 713/186 |
| 2004/0117653 A1 * | 6/2004 | Shapira et al. .............. | 713/201 |
| 2005/0111446 A1 * | 5/2005 | Greaves et al. ............. | 370/389 |
| 2007/0249416 A1 * | 10/2007 | Gazdic et al. .............. | 463/16 |

FOREIGN PATENT DOCUMENTS

| | | |
|---|---|---|
| JP | HEI 11-027324 | 1/1999 |
| JP | 2001-136159 | 5/2001 |
| JP | 2001230813 | 8/2001 |
| JP | 2004-135134 | 3/2004 |
| JP | 2004-187114 | 7/2004 |
| JP | 2004-304696 | 10/2004 |
| JP | 2005-223673 | 8/2005 |

OTHER PUBLICATIONS

Japanese Office Action issued Jan. 27, 2011, corresponding to Japanese Appln. No. 2006-024646.

* cited by examiner

*Primary Examiner* — Daniel J Ryman
*Assistant Examiner* — Jay P Patel
(74) *Attorney, Agent, or Firm* — K&L Gates LLP

(57) ABSTRACT

An information processing device is provided. The information processing device includes a frame acquiring unit for acquiring a frame using a signal transmitted via a network, a computing unit for computing a check sequence on the basis of data included in the frame, a checking unit for checking whether the frame is corrupted by checking whether the check sequence coincides with a check sequence added to the frame in advance, a storing unit for storing a table that is a list of check sequences computed in advance on the basis of a plurality of pieces of data representing addresses of frames to be received by the information processing device, and a determining unit for determining whether the frame should be received by determining whether a check sequence computed by the computing unit on the basis of data representing a destination address of the frame coincides with any one of the check sequences included in the table.

7 Claims, 12 Drawing Sheets

PRIOR ART

FIG. 3

| INDEX | MAC ADDRESS |
|---|---|
| 0 | 08:00:46:ea:10:be |
| 1 | 01:00:5e:00:00:0a |
| 2 | 01:00:5e:00:00:05 |

PRIOR ART

FIG. 8

| MAC ADDRESS |
| --- |
| 08:00:46:ea:10:be |
| 01:00:5e:00:00:0a |
| 01:00:5e:00:00:05 |

FIG. 9

| INDEX | CRC |
| --- | --- |
| 0 | 0x02180fd83 |
| 1 | 0xb199e389 |
| 2 | 0x2126fe18 |

FIG. 10

| INDEX | CRC LOWER 6 BITS |
|---|---|
| 0 | 0x03 |
| 1 | 0x09 |
| 2 | 0x18 |

FIG. 11

| INDEX | HASH VALUE |
|---|---|
| 0 | 0x06 |
| 1 | 0x29 |
| 2 | 0x24 |

INFORMATION PROCESSING DEVICE, INFORMATION PROCESSING METHOD, AND RECORDING MEDIUM FOR REDUCING CONSUMPTION OF MEMORY CAPACITY

CROSS REFERENCES TO RELATED APPLICATIONS

The present application claims priority to Japanese Patent Application JP 2006-024646 filed in the Japanese Patent Office on Feb. 1, 2006, the entire contents of which is incorporated herein by reference.

BACKGROUND

The present application relates to information processing devices, information processing methods, programs, and recording media, and, more particularly, to an information processing device, an information processing method, a program, and a recording medium capable of realizing a user-friendly and low-cost network interface card.

As an example of a network-based data communication system, the Internet is known as a wide-area communication network. In addition, a local area network (LAN) such as an Ethernet (registered trademark) network or a token ring (registered trademark) network constructed in a narrow area, for example, on the premises of a company or in a single building is known.

For example, a terminal such as a personal computer connected to an Ethernet network receives an Ethernet frame. In the terminal, DMA (Direct Memory Access) processing is performed with a memory controller to transmit the received frame to a memory. In addition, information on the fact that this DMA processing has been completed is transmitted to a CPU (Central Processing Unit), whereby this Ethernet frame receiving processing in the terminal is completed.

However, if the transmission of all frames acquired by a network interface card connected to a communication medium such as a cable is performed using the DMA technique, terminal capability is markedly decreased. Accordingly, address filtering processing is usually performed. In the address filtering processing, an address included in header information of a frame acquired by a network interface card is compared with address information stored in a table, which has been set in advance, to check whether the address included in the communication data is stored in the table.

Currently, as network communication becomes faster, a technique of performing the above-described address filtering processing within a network interface card using a dedicated function provided therefor without requiring a CPU to execute software for the address filtering processing is becoming increasingly popular (see, for example, Japanese Unexamined Patent Application Publication No. 2001-230813).

FIG. 1 is a block diagram showing an exemplary configuration of a network interface card for performing address filtering processing. A frame acquisition unit 21 acquires an Ethernet frame from a communication medium, and transmits the acquired frame to an FCS checking unit 22.

The FCS checking unit 22 compares data (a code) stored in an FCS (Frame Check Sequence) field included in the Ethernet frame with a CRC (Cyclic Redundancy Check) code calculated by a CRC calculation unit 23 to determine whether the acquired frame is corrupted. The CRC calculation unit 23 calculates a 32-bit CRC code on the basis of data included in a portion other than the FCS field of the acquired frame.

If the FCS checking unit 22 checks that the acquired frame is not corrupted, an address filtering unit 24 performs address filtering processing on the basis of a destination MAC address included in the frame and an address table stored by an address table management unit 25, and then transmits the frame to a DMA control unit 26. The address table management unit 25 has an address table storing a MAC address provided for the network interface card (unicast MAC address) and a multicast MAC address.

The DMA control unit 26 performs DMA processing to transmit data of the frame received from the address filtering unit 24 to a memory.

FIG. 2 is a flowchart describing an example of frame receiving processing performed in the network interface card shown in FIG. 1. In step S1, the frame acquisition unit 21 acquires an Ethernet frame from a communication medium, and transmits the acquired frame to the FCS checking unit 22 and the CRC calculation unit 23.

In step S2, the CRC calculation unit 23 calculates a 32-bit CRC code on the basis of data included in a portion other than the FCS field of the frame acquired in step S1.

In step S3, the FCS checking unit 22 compares data (a code) stored in the FCS field of the frame acquired in step S1 with the CRC code calculated in step S2 to determine whether the codes coincide. If the codes coincide, it is determined that the frame acquired in step S1 is not corrupted, and then the process proceeds to step S4.

In step S4, the address filtering unit 24 checks a destination MAC address included in the frame.

In step S5, the address filtering unit 24 determines whether the destination MAC address checked in step S4 is included in an address table stored by the address table management unit 25.

FIG. 3 is a diagram showing an exemplary address table stored by the address table management unit 25. An address table shown in FIG. 3 stores three (three types of) MAC addresses corresponding to indexes 0, 1, and 2. Here, each of the MAC addresses is composed of six octets (48 bits) which are separated by colons in units of octets and each of which is represented by a hexadecimal number.

A MAC address corresponding to the index 0 is defined as a unicast MAC address, and MAC addresses corresponding to the indexes 1 and 2 are defined as multicast MAC addresses. A frame in which the MAC address corresponding to the index 0, 1, or 2 is set as a destination MAC address will be received by a terminal implementing the network interface card.

Referring back to FIG. 2, in step S5, whether the destination MAC address checked in step S4 coincides with any one of the MAC addresses corresponding to the indexes 0, 1, and 2 is determined.

In step S5, if it is determined that the destination MAC address checked in step S4 is included in the address table stored by the address table management unit 25, the process proceeds to step S6. In step S6, the DMA control unit 26 performs DMA transmission. That is, data included in the frame acquired in step S1 is transmitted to a memory by performing the DMA processing.

On the other hand, if it is determined in step S3 that the data (code) included in the FCS field of the frame acquired in step S1 does not coincide with the CRC code calculated in step S2, or if it is determined in step S5 that the destination MAC address checked in step S4 is not included in the address table, the process proceeds to step S7. In step S7, the frame acquired in step S1 is removed.

Currently, multicast communication is in high demand in many applications, and the number of MAC addresses to be stored in an address table is therefore increased. However, since there is a limit to a memory capacity, sometimes, the required number of MAC addresses cannot be stored in a memory. In order to resolve this difficulty, a solution can be considered in which the hash values of MAC addresses are calculated, and only the calculated hash values are stored in an address table. Consequently, the consumption of the memory capacity can be reduced.

For example, if a 6-bit hash value is stored in an address table instead of a 48-bit MAC address, the size of the address table can be reduced.

However, in order to compute the above-described hash value, an additional functional block for the computation has to be implemented in a network interface card.

That is, if address filtering processing is performed using an address table in which hash values are stored, the address filtering unit 24 causes a functional block for computing a hash value to compute the hash value of a destination MAC address included in an acquired frame, and then performs address filtering processing on the basis of the result of the computation (the hash value of the destination MAC address) and an address table stored by the address table management unit 25. In this case, the functional block for computing the hash value of the destination MAC address has to be disposed.

Thus, in a known technique, the maximum number of addresses capable of being stored in an address table is not sufficient. In order to increase the number, the configuration of a network interface card is required to be changed. Accordingly, it is difficult to realize a user-friendly and low-cost network interface card.

SUMMARY

It is desirable to realize a user-friendly and low-cost network interface card.

An information processing device according to an embodiment includes: a frame acquiring unit configured to acquire a frame that is a predetermined unit of data transmission using a signal transmitted via a network; a computing unit configured to compute a check sequence on the basis of data included in the frame in a predetermined manner; a checking unit configured to check whether the frame is corrupted by checking whether the check sequence computed by the computing unit coincides with a check sequence added to the frame in advance; a storing unit configured to store a table that is a list of check sequences computed in advance in the predetermined manner on the basis of a plurality of pieces of data representing addresses of frames to be received by the information processing device; and a determining unit configured to determine whether the frame should be received by determining whether a check sequence computed by the computing unit in the predetermined manner on the basis of data representing a destination address of the frame acquired by the frame acquiring unit coincides with any one of the check sequences included in the table stored by the storing unit.

The computing unit can compute the check sequence by calculating a CRC (Cyclic Redundancy Check) code on the basis of data included in the frame.

The storing unit can store only data partially extracted in a predetermined manner from each of the check sequences, and the determining unit can determine whether data partially extracted in the predetermined manner from the check sequence computed by the computing unit on the basis of data representing a destination address of the frame coincides with any one of a plurality of pieces of data included in a table stored by the storing unit.

The information processing device can further include a generating unit configured to generate a message digest used for message authentication performed between terminals for transmitting and receiving the frame.

The storing unit can store a table that is a list of message digests computed in advance on the basis of a plurality of pieces of data representing addresses of frames to be received by the information processing device, and the determining unit can determine whether a message digest generated by the generating unit on the basis of data representing a destination address of the frame coincides with any one of the message digests included in the table stored by the storing unit.

The information processing device can further include a transmitting unit configured to transmit the frame by performing DMA (Direct Memory Access) processing when the determining unit determines that the frame should be received.

An information processing method according to an embodiment includes the steps of: acquiring a frame that is a predetermined unit of data transmission using a signal transmitted via a network; computing a check sequence on the basis of data included in the frame in a predetermined manner; checking whether the frame is corrupted by checking whether the computed check sequence coincides with a check sequence added to the frame in advance; computing a check sequence on the basis of data representing a destination address of the frame in the predetermined manner when it is determined that the frame is not corrupted; and determining whether the frame should be received by determining whether the check sequence computed on the basis of data representing a destination address of the frame coincides with any one of check sequences computed in advance on the basis of a plurality of pieces of data representing addresses of frames to be received in the predetermined manner, the check sequences being stored in a table.

A computer readable program according to an embodiment includes the steps of: controlling acquisition of a frame that is a predetermined unit of data transmission using a signal transmitted via a network; controlling computation of a check sequence performed in a predetermined manner on the basis of data included in the frame; controlling checking of whether the frame is corrupted by checking whether the computed check sequence coincides with a check sequence added to the frame in advance; controlling computation of a check sequence performed on the basis of data representing a destination address of the frame in the predetermined manner when it is determined that the frame is not corrupted; and controlling determination of whether the frame should be received by determining whether the check sequence computed on the basis of data representing a destination address of the frame coincides with any one of check sequences computed in advance on the basis of a plurality of pieces of data representing addresses of frames to be received in the predetermined manner, the check sequences being stored in a table.

According to an embodiment, a frame that is a predetermined unit of data transmission is acquired using a signal transmitted via a network, a check sequence is computed on the basis of data included in the frame in a predetermined manner, whether the frame is corrupted is checked by checking whether the computed check sequence coincides with a check sequence added to the frame in advance, a check sequence is computed on the basis of data representing a destination address of the frame in the predetermined manner when it is determined that the frame is not corrupted, and whether the frame should be received is determined by determining whether the check sequence computed on the basis of data representing a destination address of the frame coincides with any one of check sequences computed in advance on the basis of a plurality of pieces of data representing addresses of frames to be received in the predetermined manner, the check sequences being stored in a table.

According to an embodiment, a user-friendly and low-cost network interface card can be realized.

Additional features and advantages are described herein, and will be apparent from, the following Detailed Description and the figures.

BRIEF DESCRIPTION OF THE FIGURES

FIG. 3 is a diagram showing an exemplary known address table.

FIG. 8 is a diagram showing exemplary MAC addresses.

FIG. 9 is a diagram showing an exemplary address table according to an embodiment.

FIG. 10 is a diagram another exemplary address table according to an embodiment.

FIG. 11 is a diagram showing an exemplary address table created using hash values.

DETAILED DESCRIPTION

Figure 1:
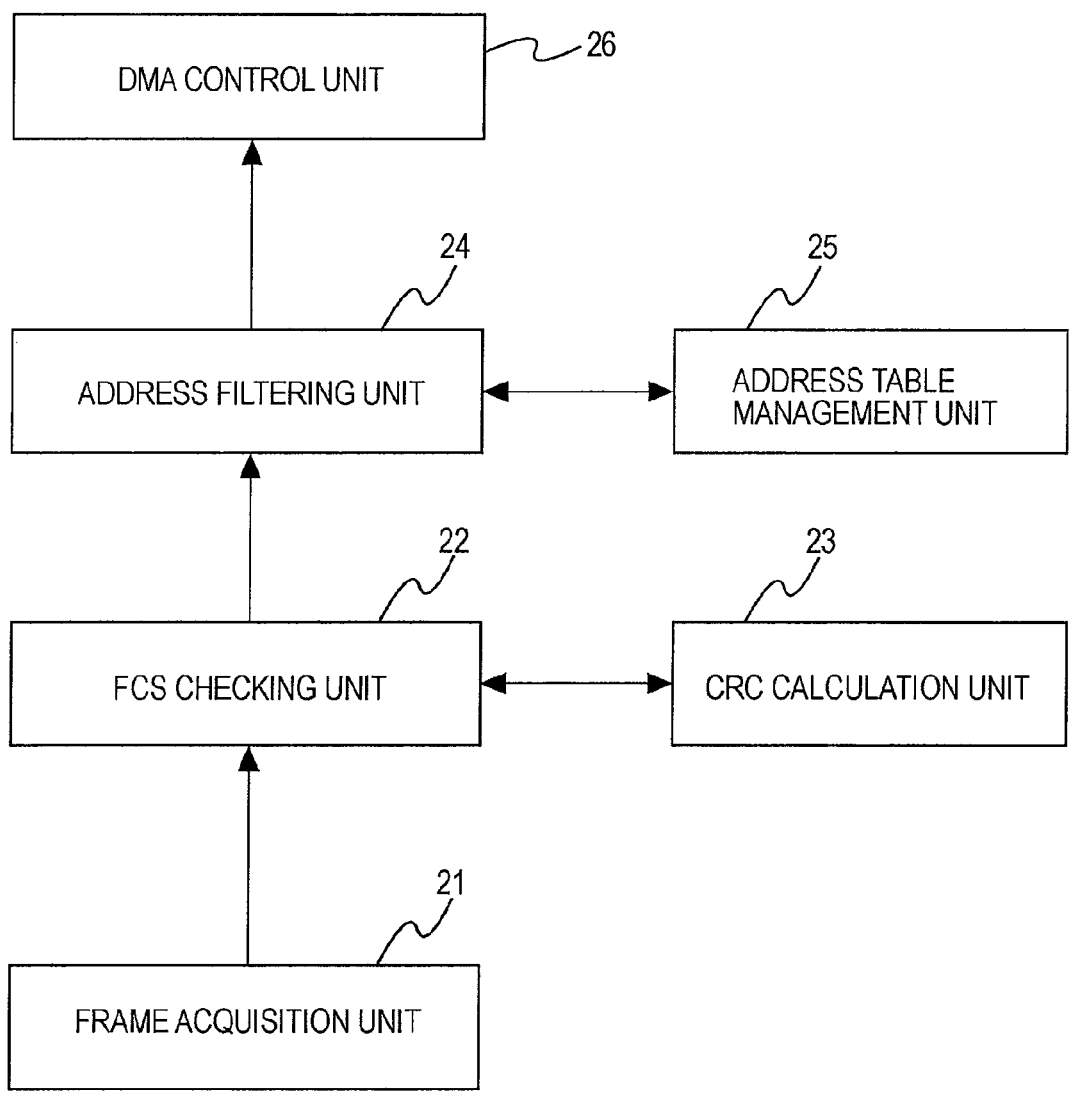
FIG. 1 is a block diagram showing an exemplary configuration of a known network interface card.
Figure 2:
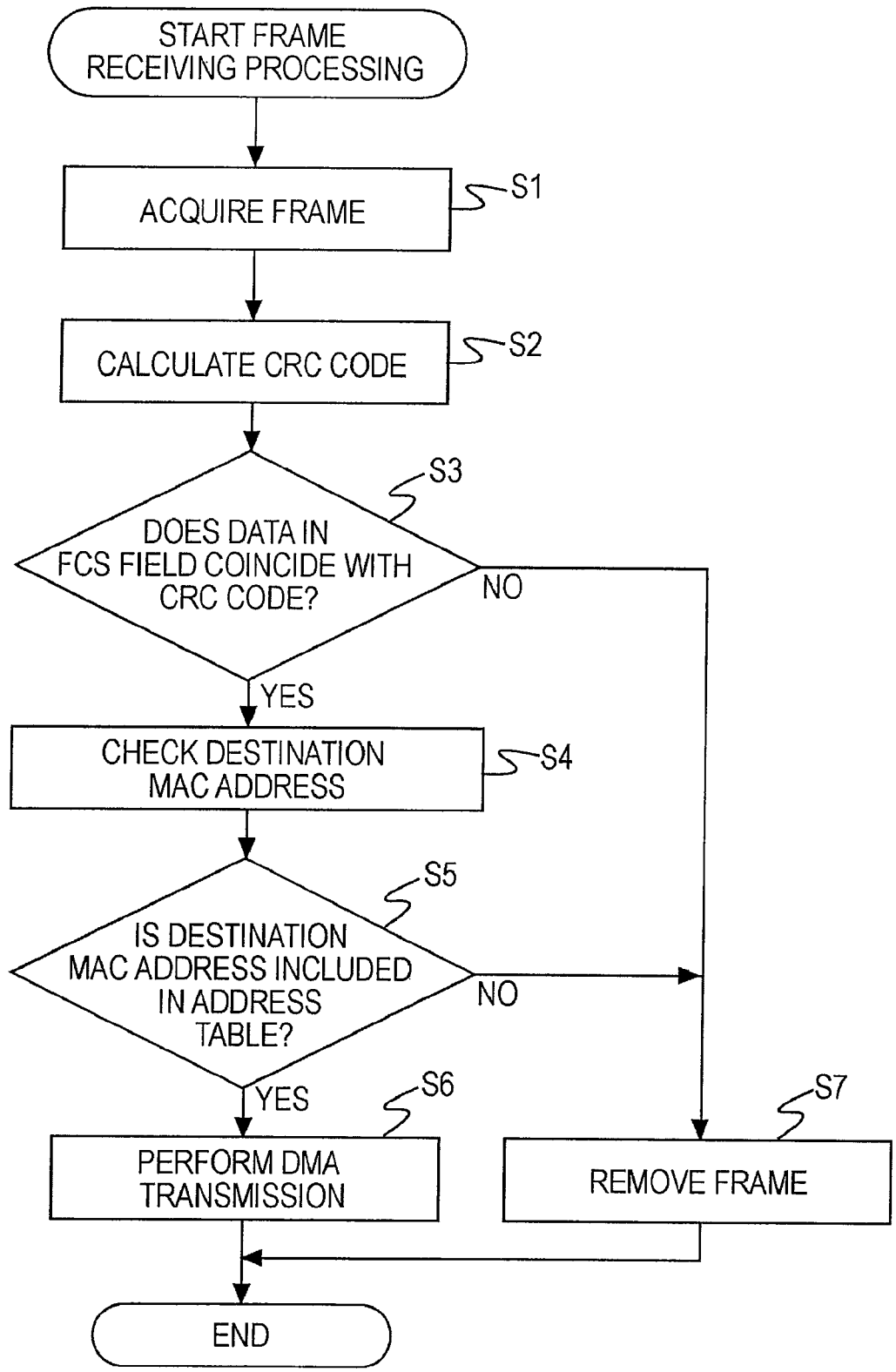
FIG. 2 is a flowchart describing frame receiving processing performed in the network interface card shown in FIG. 1.

An information processing device according to an embodiment includes: a frame acquiring unit (for example, a frame acquisition unit 221 shown in FIG. 6) configured to acquire a frame that is a predetermined unit of data transmission using a signal transmitted via a network; a computing unit (for example, a CRC calculation unit 223 shown in FIG. 6) configured to compute a check sequence on the basis of data included in the frame in a predetermined manner; a checking unit (for example, an FCS checking unit 222 shown in FIG. 6) configured to check whether the frame is corrupted by checking whether the check sequence computed by the computing unit coincides with a check sequence added to the frame in advance; a storing unit (for example, an address table management unit 225 shown in FIG. 6) configured to store a table that is a list of check sequences computed in advance in the predetermined manner on the basis of a plurality of pieces of data representing addresses of frames to be received by the information processing device; and a determining unit (for example, an address filtering unit 224 shown in FIG. 6) configured to determine whether the frame should be received by determining whether a check sequence computed by the computing unit in the predetermined manner on the basis of data representing a destination address of the frame acquired by the frame acquiring unit coincides with any one of the check sequences included in the table stored by the storing unit.

In this information processing device, the storing unit can store only data (for example, the lower six bits) partially extracted in a predetermined manner from each of the check sequences, and the determining unit can determine whether data partially extracted in the predetermined manner from the check sequence computed by the computing unit on the basis of data representing a destination address of the frame coincides with any one of a plurality of pieces of data included in a table stored by the storing unit.

This information processing device can further include a generating unit (for example, an MD calculation unit 252 shown in FIG. 13) configured to generate a message digest used for message authentication performed between terminals for transmitting and receiving the frame.

This information processing device can further include a transmitting unit (for example, a DMA control unit 226 shown in FIG. 6) configured to transmit the frame by performing DMA (Direct Memory Access) processing when the determining unit determines that the frame should be received.

Figure 7:
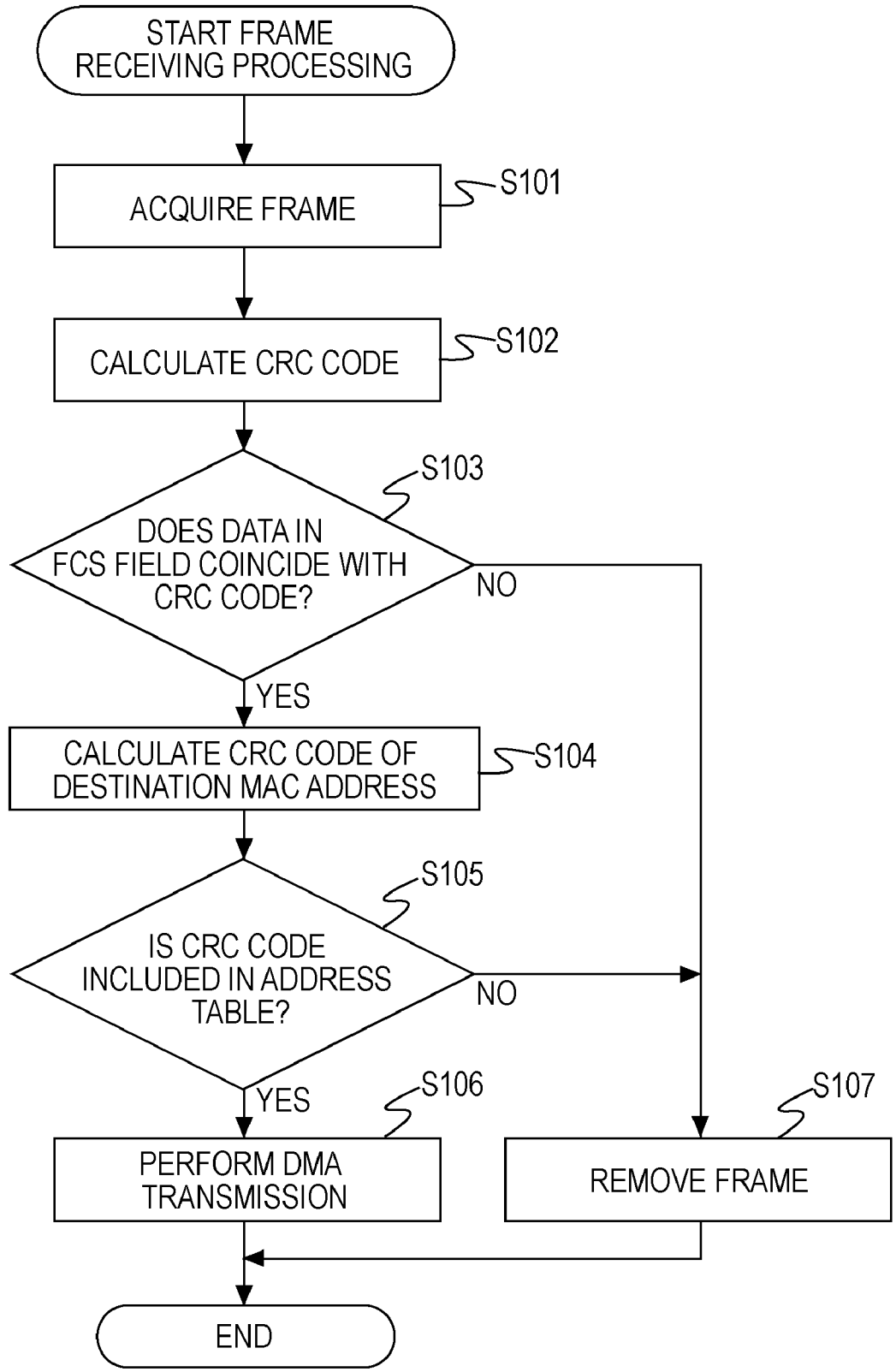
FIG. 7 is a flowchart describing frame receiving processing performed in the network interface card shown in FIG. 6.

An information processing method according to an embodiment includes the steps of: acquiring a frame that is a predetermined unit of data transmission using a signal transmitted via a network (for example, the processing of step S101 shown in FIG. 7); computing a check sequence on the basis of data included in the frame in a predetermined manner (for example, the processing of step S102 shown in FIG. 7); checking whether the frame is corrupted by checking whether the computed check sequence coincides with a check sequence added to the frame in advance (for example, the processing of step S103 shown in FIG. 7); computing a check sequence on the basis of data representing a destination address of the frame in the predetermined manner when it is determined that the frame is not corrupted (for example, the processing of step S104 shown in FIG. 7); and determining whether the frame should be received by determining whether the check sequence computed on the basis of data representing a destination address of the frame coincides with any one of check sequences computed in advance on the basis of a plurality of pieces of data representing addresses of frames to be received in the predetermined manner, the check sequences being stored in a table (for example, the processing of step S105 shown in FIG. 7).

An embodiment will be described with reference to the accompanying drawings.

Figure 4:
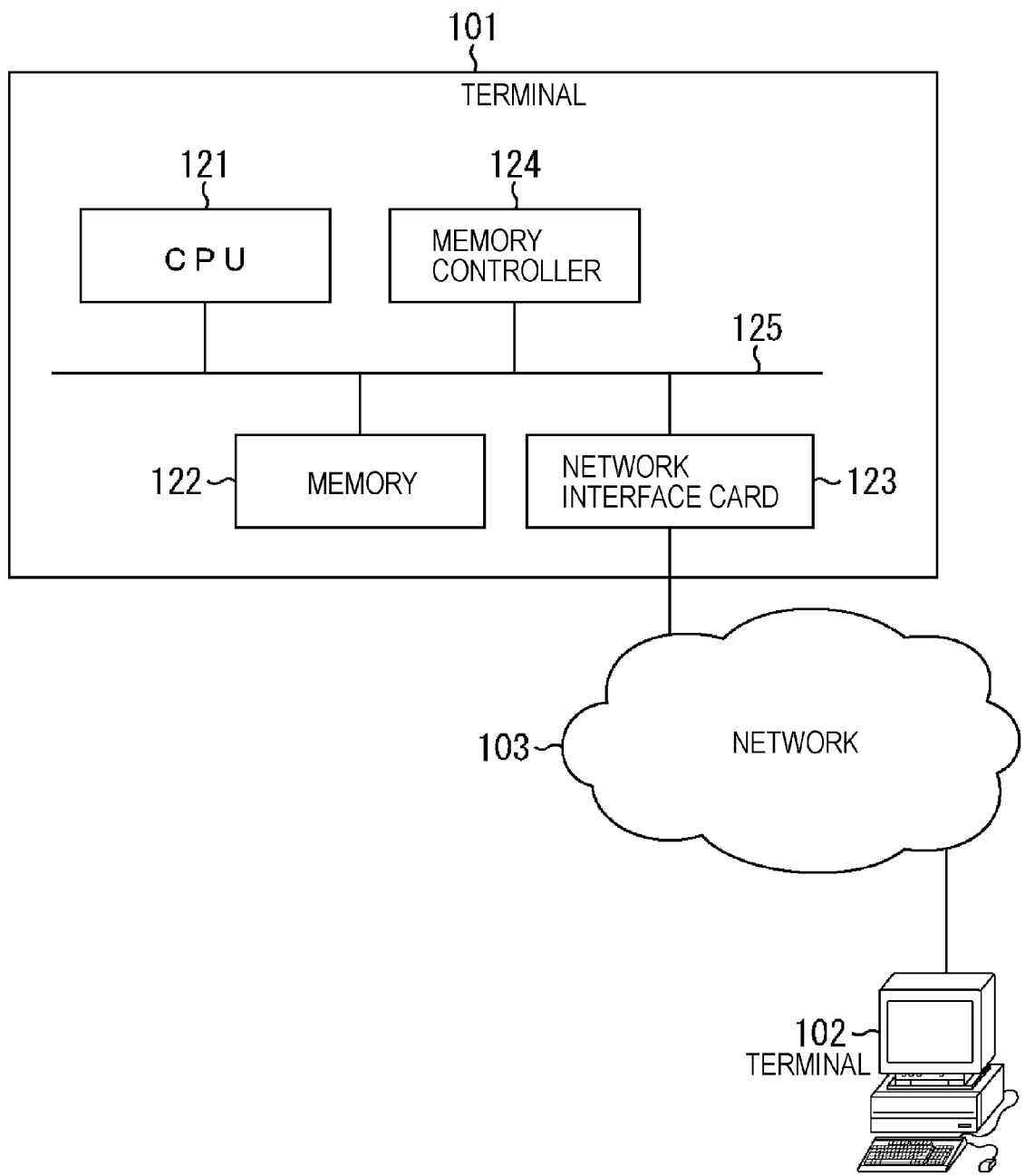
FIG. 4 is a diagram showing an exemplary configuration of a communication system according to an embodiment.

FIG. 4 is a diagram showing an exemplary configuration of a communication system according to an embodiment.

A terminal 101 is configured to transmit and receive information to and from a terminal 102 via a network 103.

The terminal 101 is, for example, a personal computer, and contains a CPU (Central Processing Unit) 121, a memory 122 such as a RAM (Random-Access Memory), a network interface card 123 for performing communication in accordance with a predetermined protocol such as Ethernet and functioning as an interface for connection to a network, and a memory controller 124 for controlling DMA (Direct Memory Access) processing performed to transmit a frame, which has been acquired by the network interface card 123, to the memory 122. The CPU 121, the memory 122, the network interface card 123, and the memory controller 124 are connected to each other via a data bus 125.

As an example of a network-based data communication system, the Internet is known as a wide-area communication network. In addition, a local area network (LAN) such as an Ethernet network or a token ring network constructed in a narrow area, for example, on the premises of a company or in a single building is known. A connection portion between the terminal 101 and the network 103 is configured with a communication medium for performing Ethernet communication.

In the terminal 101, Ethernet frame receiving processing is performed as follows. DMA (Direct Memory Access) processing is performed with the memory controller 124 to transmit a received frame to the memory 122. In addition, information on the fact that this DMA processing has been completed is transmitted to the CPU 121, whereby this Ethernet frame receiving processing in the terminal 101 is completed.

However, if the transmission of all frames acquired by the network interface card 123 connected to a communication medium such as a cable is performed using the DMA technique, terminal capability is markedly decreased. Accordingly, address filtering processing is performed in which an address included in the header information of the frame acquired by the network interface card 123 is compared with address information stored in a table, which has been set in advance, to check whether the address included in the communication data is stored in the table.

Figure 5:
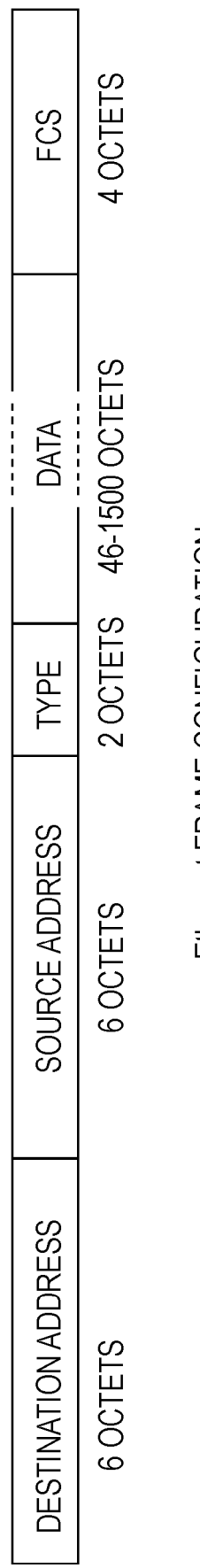
FIG. 5 is a diagram showing an exemplary configuration of an Ethernet frame.

FIG. 5 is a diagram showing a configuration of an Ethernet frame. As shown in FIG. 5, the Ethernet frame includes a Destination Address field of 6 octets (48 bits), a Source Address field of 6 octets (48 bits), a Type field of 2 octets (16 bits), a Data field of 46 to 1500 octets (368 to 12000 bits), and an FCS (Frame Check Sequence) field of 4 octets (32 bits).

A destination MAC (Media Access Control) address is stored in the Destination Address field. Here, a MAC address is a specific number assigned to each interface connected to an Ethernet network. For example, if the network 103 is an Ethernet network, a MAC address assigned to the network interface card 123 is stored in the Destination Address field when the terminal 102 transmits data to the terminal 101.

A source MAC address is stored in the Source Address field. For example, if the network 103 is an Ethernet network, a MAC address assigned to a network interface card attached to the terminal 102 is stored in the Source Address field when the terminal 102 transmits data to the terminal 101.

A data item representing the byte length of a frame or the type of an upper layer is stored in the Type field. For example, if a data item 0x800 is stored in the Type field, this indicates that the upper layer of this frame corresponds to an IP packet.

Information required to be transmitted by this frame is stored in the Data field.

Error detection data, which has been computed on the basis of data items stored in the Destination Address, Source Address, Type, and Data fields, is stored in the FSC field. In the case of an Ethernet frame, a 32-bit CRC (Cyclic Redundancy Check) code is stored in the FCS field. The computation of a CRC code in an Ethernet frame is defined in detail in Appendix in RFC 1952.

The above-described address filtering processing is performed by determining whether the MAC address stored in the Destination Address field is included in a table that has been set in advance. In this embodiment, the network interface card 123 performs this address filtering processing.

Figure 6:
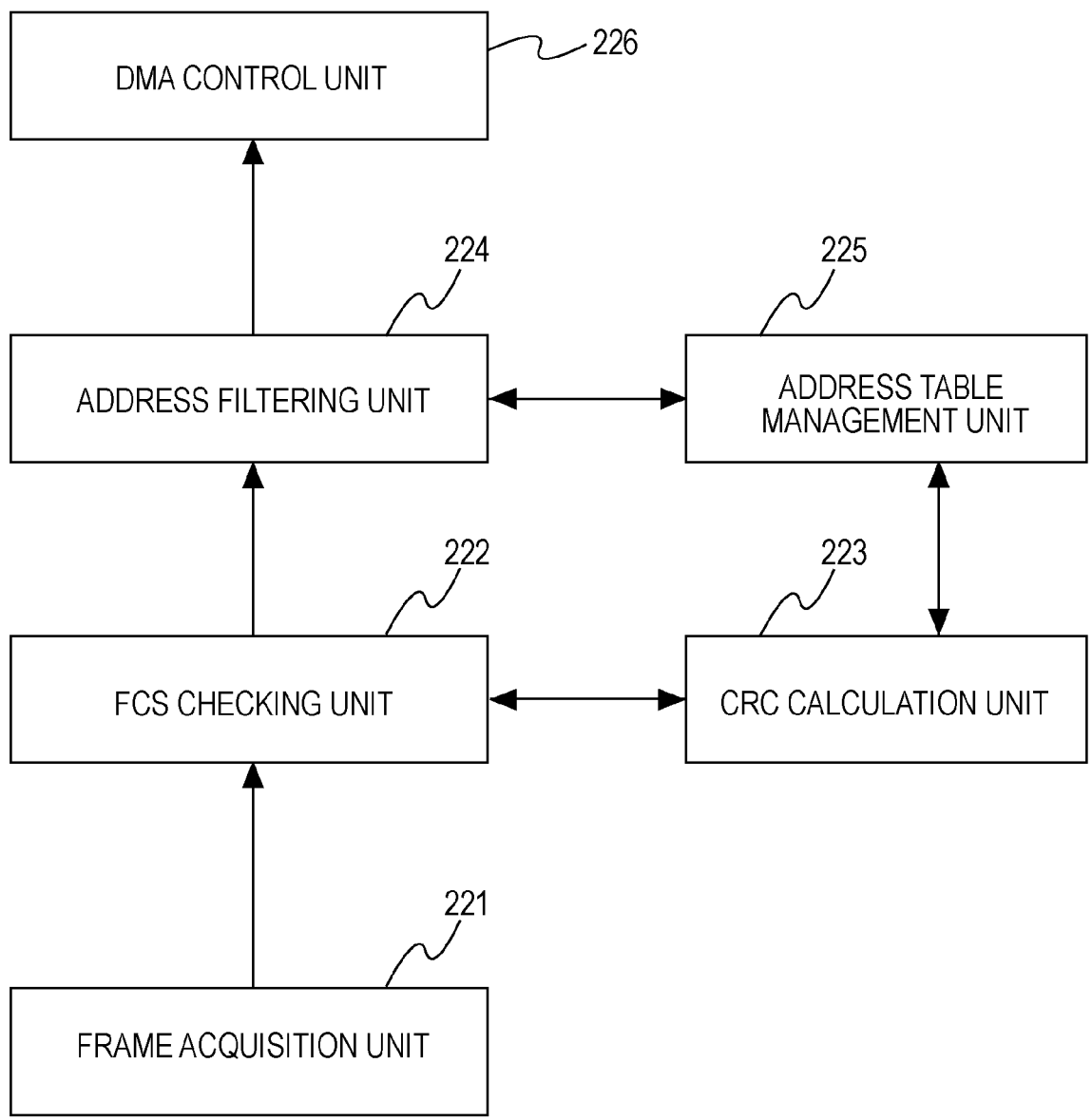
FIG. 6 is a block diagram showing an exemplary configuration of a network interface card according to an embodiment.

FIG. 6 is a block diagram showing an exemplary configuration of the network interface card 123 for performing address filtering processing. The frame acquisition unit 221 acquires an Ethernet frame from a communication medium, and transmits the acquired frame to the FCS checking unit 222.

The FCS checking unit 222 compares data (a code) stored in the FCS field included in the Ethernet frame with a CRC code calculated by the CRC calculation unit 223 to determine whether the acquired frame is corrupted. As described previously, a CRC code, which has been computed by a source terminal on the basis of data items stored in the Destination Address, Source Address, Type, and Data fields, is stored in the FCS field of the acquired frame. If this CRC code is different from a CRC code computed by a destination terminal, it can be determined that the acquired frame includes a bit error or the like. On the other hand, if the CRC code computed by the source terminal coincides with the CRC code computed by the destination terminal, it can be determined that the acquired frame has no bit errors or the like.

The CRC calculation unit 223 calculates a 32-bit CRC code on the basis of data included in a portion other than the FCS field of the acquired frame (data items stored in the Destination Address, Source Address, Type, and Data fields). In addition, the CRC calculation unit 223 calculates a 32-bit CRC code as appropriate on the basis of a destination MAC address stored in the frame acquired by the frame acquisition unit 221, and transmits the calculated CRC code to the address filtering unit 224.

If the FCS checking unit 222 checks that the acquired frame has no bit errors or the like, that is, the acquired frame is not corrupted, the address filtering unit 224 performs address filtering processing on the basis of the CRC code, which has been calculated by the CRC calculation unit 223 on the basis of the destination MAC address included in the acquired frame, and an address table stored by the address table management unit 225, and then transmits the frame to the DMA control unit 226.

The address table management unit 225 has an address table in which data items representing a MAC address provided for the network interface card 123 (unicast MAC address) and a multicast MAC address are stored. The address table management unit 225 creates or updates an address table, which will be described with reference to FIGS. 9 and 10, in accordance with a user's operation or an instruction transmitted from the CPU 121, and stores the created or updated address table. The details of the data items representing MAC addresses stored in the address table will be described later.

The DMA control unit 226 performs DMA processing to transmit the frame received from the address filtering unit 224 to the memory 122.

FIG. 7 is a flowchart describing an example of frame receiving processing performed in the network interface card 123 shown in FIG. 6. In step S101, the frame acquisition unit 221 acquires an Ethernet frame from a communication medium, and transmits the acquired frame to the FCS checking unit 222 and the CRC calculation unit 223.

In step S102, the CRC calculation unit 223 calculates a 32-bit CRC code on the basis of data included in a portion other than the FCS field of the frame acquired in step S101.

In step S103, the FCS checking unit 222 compares data (a code) stored in the FCS field of the frame acquired in step S101 with the CRC code calculated in step S102 to determine whether the codes coincide. If the codes coincide, it is determined that the frame acquired in step S101 is not corrupted, and then the process proceeds to step S104.

In step S104, the address filtering unit 224 causes the CRC calculation unit 223 to calculate the CRC code of a destination MAC address included in the acquired frame.

In step S105, the address filtering unit 24 determines whether the CRC code calculated in step S104 is included in an address table stored by the address table management unit 225.

The address table management unit 225 stores an address table including a single or a plurality of data items, for example, which has been included therein in accordance with a user's operation or setting. The data item or data items represents a single or a plurality of destination MAC addresses included in a single or a plurality of frames which the terminal 101 should receive. FIG. 8 is a diagram showing exemplary destination MAC addresses included in a frame which the terminal 101 should receive.

Three MAC addresses, 08:00:46:ea:10:be, 01:00:5e:00:00:0a, and 01:00:5e:00:00:05, are illustrated in FIG. 8. Here, each of the MAC addresses is composed of six octets (48 bits) which are separated by colons in units of octets and each of which is represented by a hexadecimal number. The MAC address 08:00:46:ea:10:be corresponds to a unicast MAC address, and the MAC addresses 01:00:5e:00:00:0a and 01:00:5e:00:00:05 correspond to multicast MAC addresses. A frame in which any one of these three MAC addresses is set as a destination MAC address will be received by the terminal 101.

At that time, since there is a limit to the memory capacity of the network interface card 123, sometimes, the required number of 48-bit MAC addresses cannot be stored in the address table. Currently, multicast communication is in high demand in many applications, and the number of MAC addresses to be stored in an address table is therefore increased. Accordingly, the size reduction of an address table is desired. In order to overcome this difficulty, in this embodiment, the CRC codes of MAC addresses are calculated, and only the calculated CRC codes are stored in an address table to reduce the size of the address table and the consumption of the memory capacity.

FIG. 9 is a diagram showing an exemplary address table created using CRC codes computed from the MAC addresses shown in FIG. 8. An address table shown in FIG. 9 stores three (three types of) codes (CRC codes of MAC addresses) corresponding to indexes 0, 1, and 2. The codes corresponding to the indexes 0, 1, and 2 are CRC codes computed from the MAC addresses 08:00:46:ea:10:be, 01:00:5e:00:00:0a, and 01:00:5e:00:00:05, respectively. A leading 0x included in each of these CRC codes indicates that the following code is a hexadecimal number.

Thus, 32-bit CRC codes are stored in the address table instead of the 48-bit MAC addresses, whereby the size of the address table to be stored can be reduced.

In order to further reduce the size of the address table, only the lower six bits of each of the 32-bit CRC codes computed from the MAC addresses may be stored in the address table. FIG. 10 is a diagram showing an exemplary address table created by extracting only the lower six bits from each of the CRC codes of the MAC addresses included in the address table shown in FIG. 9.

Thus, 6-bit codes are stored in the address table instead of the 48-bit MAC addresses, whereby the size of the address table can be further reduced.

Referring back to FIG. 7, in step S105, whether the CRC code of the destination MAC address calculated in step S104 or a code corresponding to the lower six bits of the calculated CRC code coincides with any one of the codes corresponding to the indexes 0, 1, and 2 is determined.

In step S105, if it is determined that the CRC code of the destination MAC address calculated in step S104 (or a code corresponding to the lower six bits of the calculated CRC code) is included in the address table stored by the address table management unit 225, the process proceeds to step S106. In step S106, the DMA control unit 226 performs DMA transmission. That is, the data included in the frame acquired in step S101 is transmitted to the memory 122 by performing the DMA processing.

On the other hand, if it is determined in step S103 that the data (code) included in the FCS field of the frame acquired in step S101 not coincide with the CRC code calculated in step S102, or if it is determined in step S105 that the CRC code of the destination MAC address calculated in step S104 (or a code corresponding to the lower six bits of the calculated CRC code) is not included in the address table, the process proceeds to step S107. In step S107, the frame acquired in step S101 is removed.

By performing the above-described process, when the terminal 101 receives a frame, fast address filtering processing in the network interface card 123 can be achieved. In addition, the consumption of the memory capacity of the network interface card 123 can be reduced.

If only the size reduction of an address table and the reduction of consumption of a memory capacity are desired, a solution can also be considered in which the hash values of MAC addresses are calculated, and only the calculated hash values are stored in an address table.

FIG. 11 is a diagram showing an exemplary address table storing the hash values of the MAC addresses shown in FIG. 8, which are acquired by performing the following computations, instead of the MAC addresses.

First, as shown in the following equations, the sum of individual octets is computed in each of the three MAC addresses shown in FIG. 8. In the following equations, a leading 0x indicates that the following data item is a hexadecimal number.

0x08+0x00+0x46+0xea+0x10+0xbe=0x206
0x01+0x00+0x5e+0x00+0x00+0x0a=0x69
0x01+0x00+0x5e+0x00+0x00+0x05=0x64

If the lower six bits are extracted from each of the above-described computation results 0x206, 0x69, and 0x64, and are then defined as hash values, an address table storing hash values corresponding to the MAC addresses shown in FIG. 8 can be created as shown in FIG. 11. That is, 6-bit hash values are stored in the address table instead of the 46-bit MAC addresses, whereby the size of the address table can be reduced.

Figure 12:
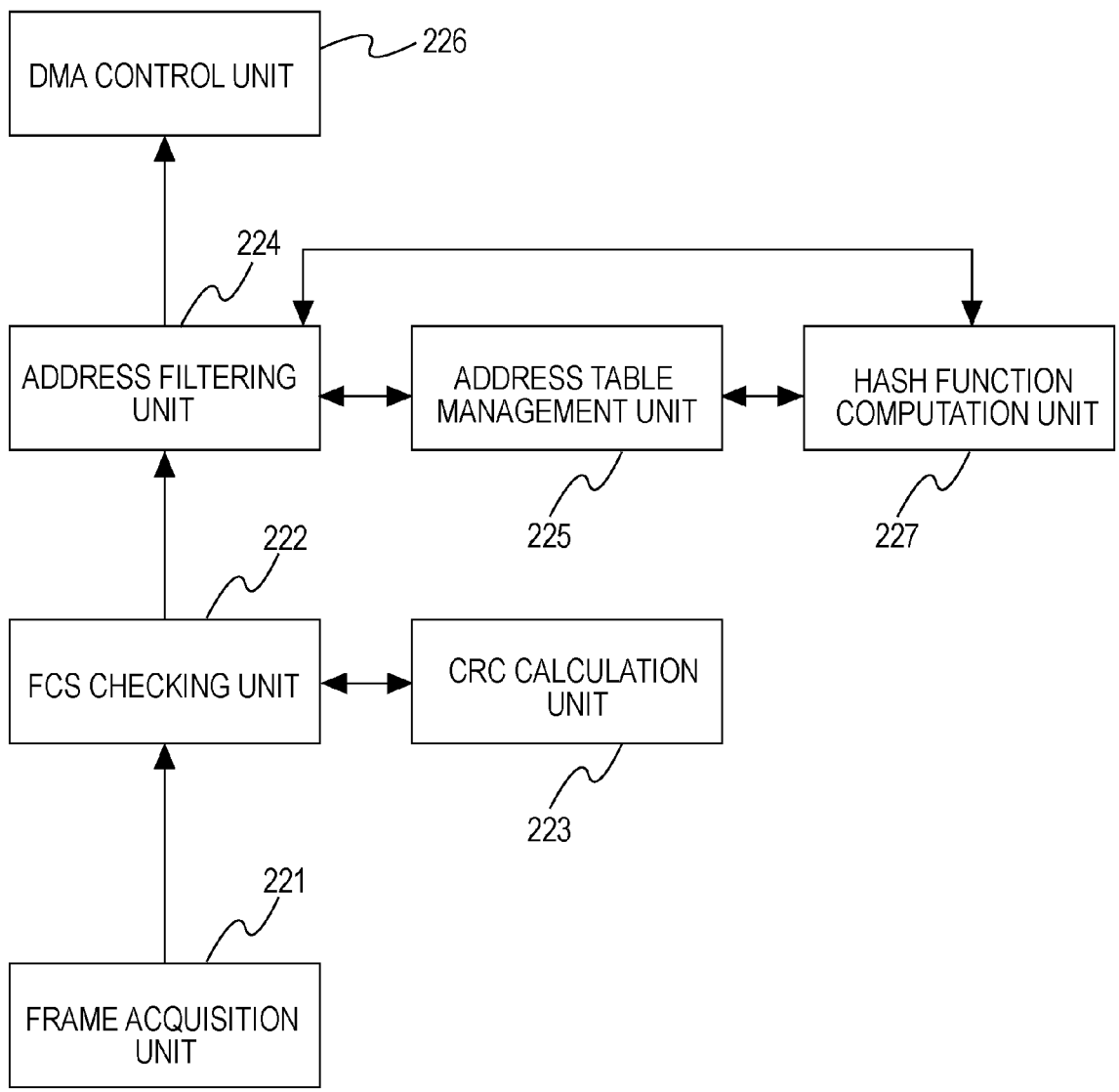
FIG. 12 is a block diagram showing an exemplary configuration of a network interface card configured to have the address table shown in FIG. 11.

However, in order to compute the above-described hash values in a network interface card, an additional functional block is required to be disposed. FIG. 12 is a diagram showing an exemplary configuration of a network interface card capable of performing address filtering processing using the address table shown in FIG. 11.

Referring to FIG. 12, a hash function computation unit 227 is disposed. This is different from the example shown in FIG. 6. That is, if address filtering processing is performed using the address table shown in FIG. 11, the address filtering unit 224 causes the hash function computation unit 227 to compute the hash value of a destination MAC address included in an acquired frame, performs address filtering processing on the basis of the computation result (the hash value of the destination MAC address) and an address table stored by the address table management unit 225, and transmits the acquired frame to the DMA control unit 226.

Thus, the configuration of a known network interface card is required to be changed. Accordingly, it is difficult to realize a user-friendly and low-cost network interface card.

In this embodiment, the CRC code of a destination MAC address is calculated. That is, a CRC code is often used as a frame check sequence for detecting whether there is a data error that has occurred in a transmission path. However, the CRC code can also be used as a hash function for calculating a 32-bit hash value from data of arbitrary bit length. Accordingly, if the CRC calculation unit 223, which is used to generate a frame check sequence in a known network interface card, also calculates the CRC code of a destination MAC address, the same function of the example shown in FIG. 12 can be achieved without significantly changing the configuration of the known network interface card.

Thus, in this embodiment, as described previously with reference to FIGS. 6 and 7, the CRC calculation unit 223, which is a functional block included in a known network interface card, calculates the CRC code of a destination MAC address. Accordingly, a user-friendly and low-cost network interface card can be realized.

Currently, network security techniques are becoming increasingly widespread, and the number of network devices implementing a network security technique such as the IPSec technique is increasing. In IPSec, IKE (Internet Key Exchange) is specified. IKE is an automatic key exchange protocol for dynamically generating encryption parameters and authentication parameters and exchanging the generated encryption parameters and authentication parameters. Accordingly, in order to implement the IPSec technique, a network device has to implement at least the MD5 authentication algorithm and the DES encryption algorithm.

Figure 13:
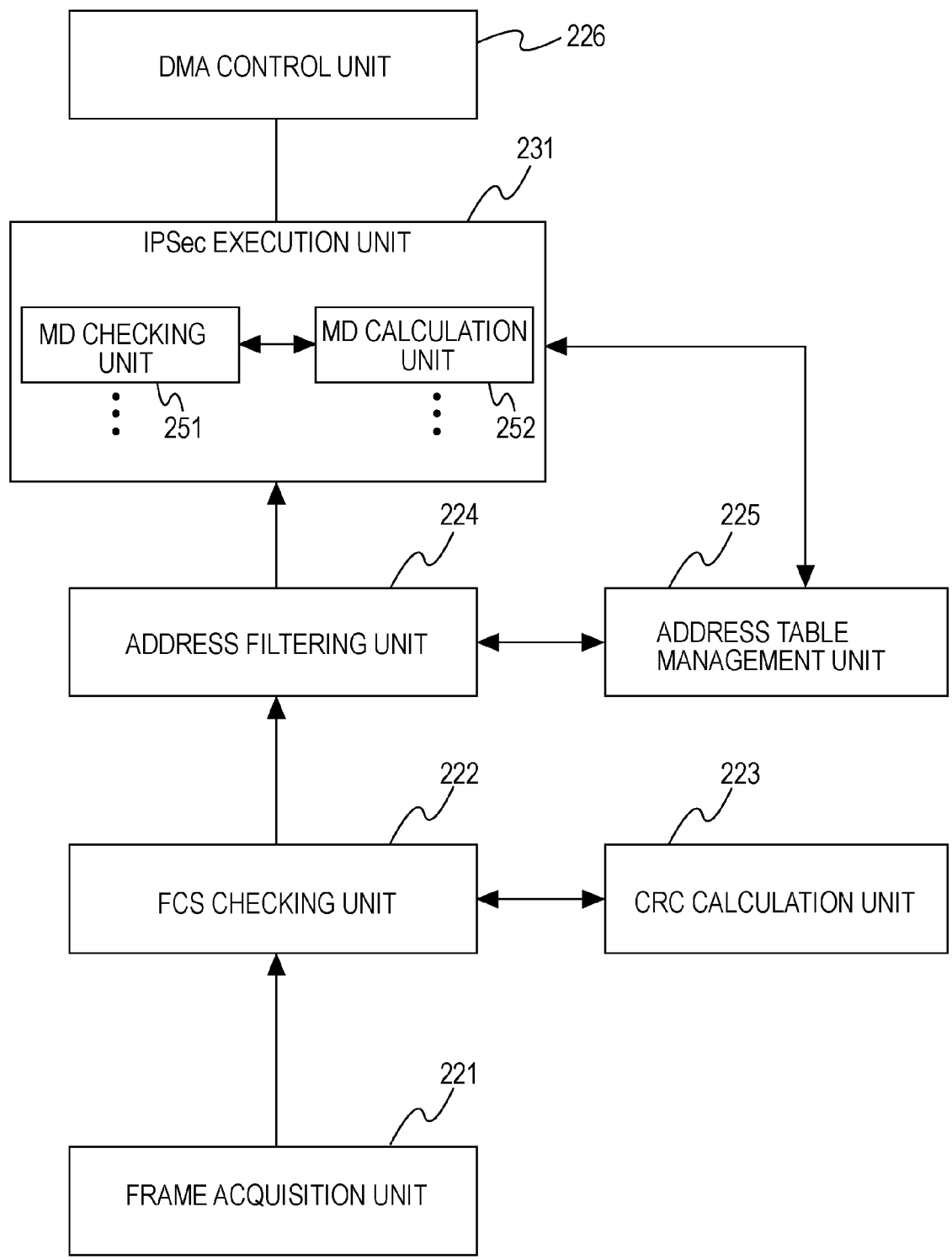
FIG. 13 is a block diagram showing another exemplary configuration of a network interface card according to an embodiment.

If a network interface card is configured to perform IPSec processing, an exemplary configuration of the network interface card is as shown in FIG. 13.

The frame acquisition unit 221, the FCS checking unit 222, the CRC calculation unit 223, the address filtering unit 224, the address table management unit 225, and the DMA control unit 226 have been described with reference to FIG. 6, and the detailed description thereof will be omitted. In the case of the example shown in FIG. 13, an IPSec execution unit 231 is disposed. This is different from the example shown in FIG. 6. The IPSec execution unit 231 is a functional block for performing processing specified by IPSec. The processing includes encryption and authentication of data of an IP packet included in an Ethernet frame transmitted from the address filtering unit 224.

As described previously, in order to implement the IPSec technique, a network device has to implement at least the MD5 authentication algorithm and the DES encryption algorithm. Accordingly, the IPSec execution unit 231 includes the MD calculation unit 252 for calculating an MD (Message Digest) specified by the MD5 algorithm and an MD checking unit 251 for checking whether the MD calculated by the MD calculation unit 252 coincides with an MD included in the IP packet. Here, an MD is a hash value of fixed length computed on the basis of original data.

For example, in a network interface card shown in FIG. 13, the size of an address table can be reduced by storing the MD of a destination MAC address, that is, the hash value of the destination MAC address in the address table.

In the example shown in FIG. 6, the CRC calculation unit 223 calculates a CRC code used to be compared with a code stored in the FCS field, and the CRC code of a destination MAC address. On the other hand, in the example shown in FIG. 13, the MD calculation unit 252 may calculate a hash value (MD) used for message authentication and the hash value (MD) of a destination MAC address.

An example of frame receiving processing performed in a network interface card shown in FIG. 13 will be described with reference to a flowchart shown in FIG. 14.

Figure 14:
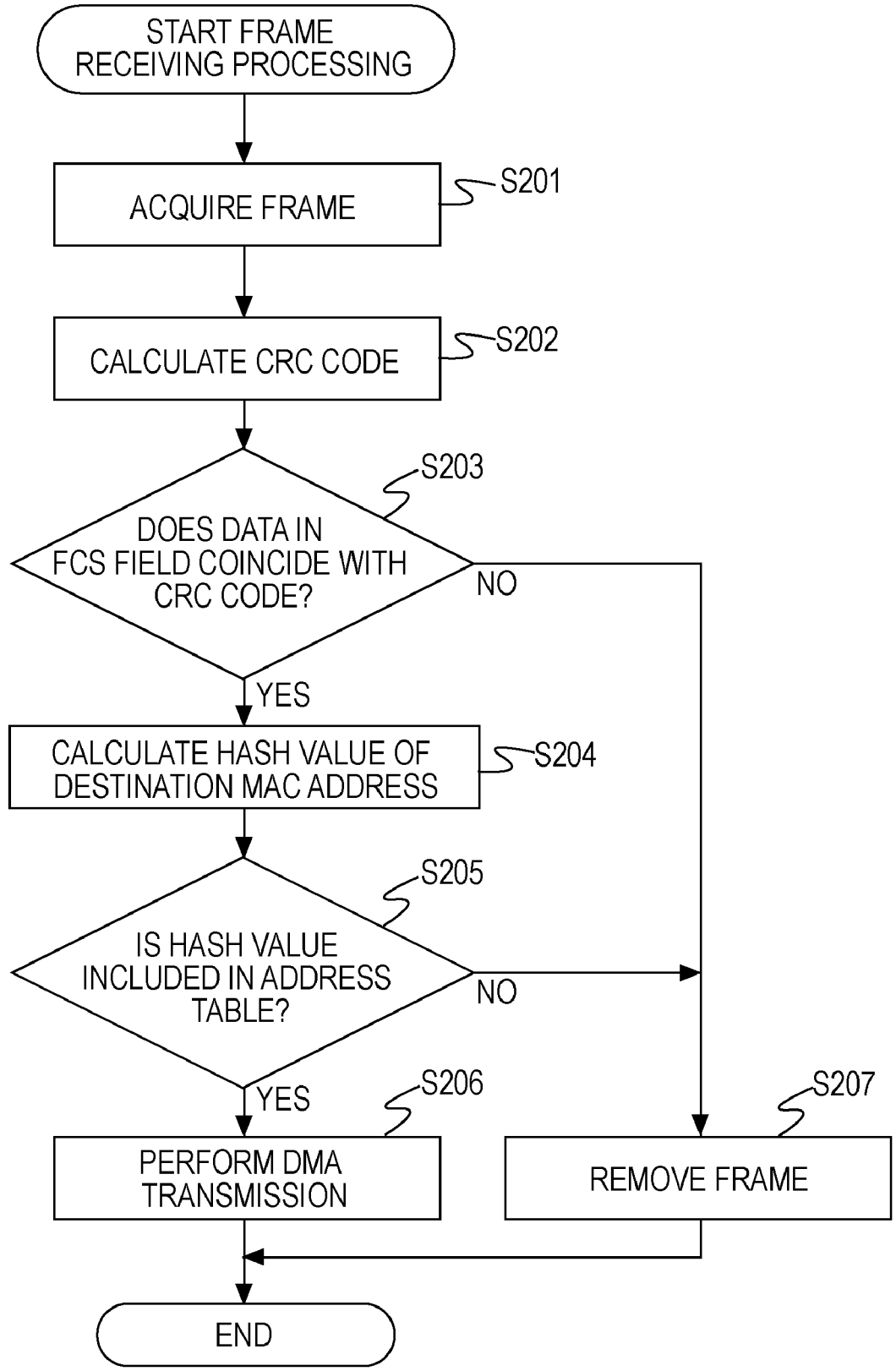
FIG. 14 is a flowchart describing frame receiving processing performed in the network interface card shown in FIG. 13.

The processing of steps S201, S202, and S203 shown in FIG. 14 are the same as that of steps S101, S102, and S103 shown in FIG. 7, and the detailed description thereof will be omitted.

In step S204, the address filtering unit 224 causes the MD calculation unit 252 to calculate the hash value of a destination MAC address included in an acquired frame.

In step S205, the address filtering unit 224 determines whether the hash value calculated in step S204 is included in an address table stored by the address table management unit 225.

In this case, the address table management unit 225 stores an address table in which hash values computed from the MAC addresses, for example, shown in FIG. 8 are included instead of the MAC addresses. Accordingly, the size of the address table can be reduced.

In step S205, whether the hash value of a destination MAC address calculated in step S204 coincides with any one of the hash values stored in the address table is determined.

In step S205, if it is determined that the hash value of the destination MAC address calculated in step S204 is included in the address table stored by the address table management unit 225, the process proceeds to step S206. In step S206, the DMA control unit 226 performs DMA transmission. That is, data included in a frame acquired in step S201 is transmitted to the memory 122 by performing the DMA processing.

On the other hand, if it is determined in step S203 that data (a code) stored in the FCS field of the frame acquired in step S201 does not coincide with a CRC code calculated in step S202, or if it is determined in step S205 that the hash value of the destination MAC address calculated in step S204 is not included in the address table, the process proceeds to step S207. In step S207, the frame acquired in step S201 is removed.

By performing the above-described process, when the terminal 101 receives a frame, fast address filtering processing in the network interface card 123 can be achieved, and the consumption of the memory capacity of the network interface card 123 can be reduced. In addition, since the IPSec execution unit 231 implemented in the network interface card 123 in advance calculates the hash value of the destination MAC address, a user-friendly and low-cost network interface card can be realized.

The above-described processing flow may be performed by hardware or software. That is, the above-described network interface card may be an information processing device, and the above-described processing flow may be performed by software installed in the information processing device. If the processing flow is performed by software, a program configuring the software is installed from a network such as the Internet or a recording medium such as a removable medium on the information processing device.

The steps for performing the above-described processing flow do not have to be executed in chronological order described above. The steps may be concurrently or individually.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An information processing device comprising:
    frame acquiring means for acquiring a frame that is a predetermined unit of data transmission using a signal transmitted via a network, said frame including a destination address and a check sequence code;
    computing means for computing:
        (i) a check sequence code based on data included in the acquired frame in a predetermined manner; and
        (ii) a message digest of the destination address included in the acquired frame, the generated message digest being used for message authentication performed between terminals for transmitting and receiving the frame;
    checking means for checking whether the acquired frame is corrupted by determining whether the computed check sequence code coincides with the check sequence code included in the acquired frame;
    storing means for storing a table including message digests computed in a predetermined manner based on a plurality of pieces of data representing addresses of frames to be received by the information processing device; and
    determining means for determining whether the acquired frame should be received or removed by determining whether the computed message digest of the destination address included in the acquired frame coincides with any one of the message digests included in the stored table;
    wherein said acquired frame is removed if it is determined that the computed check sequence code does not coincide with the check sequence code included in the acquired frame; and
    wherein said acquired frame is removed if it is determined that the computed message digest does not coincide with any one of the message digests included in the table.

2. The information processing device of claim 1, wherein the check sequence code is a CRC (Cyclic Redundancy Check) code.

3. The information processing device of claim 2,
    wherein the storing means stores data partially extracted when the checking means checks whether the acquired frame is corrupted, the data being extracted in a predetermined manner, and
    wherein the determining means determines whether the partially extracted data coincides with any data included in a table stored by the storing means.

4. The information processing device of claim 1, which includes a transmission means for transmitting the acquired frame by performing DMA (Direct Memory Access) processing, wherein if it is determined that the frame should be received, the DMA processing is performed and the frame is transmitted.

5. A method of operating an information processing device including a plurality of instructions, the method comprising:
    causing a processor to execute the plurality of instructions to:
        (i) cause a frame to be acquired using a signal transmitted via a network, said frame being a predetermined unit of data transmission and said frame including a destination address and a check sequence code;
        (ii) cause a check sequence code to be generated in a predetermined manner based on data included in the frame;
        (iii) cause a message digest of the destination address included in the acquired frame to be generated, the generated message digest being used for message authentication performed between terminals for transmitting and receiving the frame;
        (iv) determine whether the acquired frame is corrupted by determining whether the generated check sequence code coincides with the check sequence code included in the acquired frame;
        (v) cause a table to be stored, the table including message digests computed in a predetermined manner based on data representing addresses of frames to be received by the information processing device; and
        (vi) determine whether the acquired frame should be received or removed by determining whether the generated message digest of the destination address included in the acquired frame coincides with any one of the message digests included in the stored table;
    if the generated check sequence code does not coincide with the check sequence code added to the frame, causing the acquired frame to be removed; and
    if the generated message digest does not coincide with any one of the message digests included in the table, causing the acquired frame to be removed.

6. A non-transitory computer readable medium storing instructions, the non-transitory computer readable medium being a removable medium, the instructions structured to cause a processor of an information processing device to:
    cause a frame to be acquired using a signal transmitted via a network, said frame being a predetermined unit of data transmission and said frame including a destination address and a check sequence code;
    cause a check sequence code to be generated in a predetermined manner based on data included in the acquired frame;
    cause a message digest of the destination address included in the acquired frame to be generated, the generated message digest being used for message authentication performed between terminals for transmitting and receiving the frame;
    determine whether the acquired frame is corrupted by determining whether the generated check sequence code coincides with the check sequence code included in the acquired frame;
    cause a table to be stored, the table including message digests computed in a predetermined manner based on a plurality of pieces of data representing addresses of frames to be received by the information processing device;
    determine whether the acquired frame should be received or removed by determining whether the generated message digest of the destination address included in the acquired frame coincides with any one of the message digests included in the stored table;
    if the generated check sequence code does not coincide with the check sequence code added to the acquired frame, cause said acquired frame to be removed; and
    if the generated message digest does not coincide with any one of the message digests included in the table, cause said acquired frame to be removed.

7. An information processing device comprising:
    a processor; and
    at least one memory device which stores a plurality of instructions and a table including a list of message digests, wherein when executed by the processor, the plurality of instructions cause the processor to:
    acquire a frame that is a predetermined unit of data transmission using a signal transmitted via a network, said frame including a destination address and a check sequence code;

generate a check sequence code based on data included in the acquired frame in a predetermined manner;

generate a message digest of the destination address included in the acquired frame, the generated message digest being used for message authentication performed between terminals for transmitting and receiving the frame;

determine whether the acquired frame is corrupted by determining whether the generated check sequence code coincides with the check sequence code included in the acquired frame;

determine whether the frame should be received or removed by determining whether the generated message digest coincides with any one of the message digests included in the table, the message digests included in the table being determined in a predetermined manner based on data representing addresses of frames to be received by the information processing device;

if the generated check sequence code does not coincide with the check sequence code added to the acquired frame, remove said acquired frame; and if the generated message digest does not coincide with any one of the message digests included in the table, remove said acquired frame.

* * * * *